United States Patent [19]

Svenson

[11] Patent Number: 4,975,660
[45] Date of Patent: Dec. 4, 1990

[54] METHOD AND APPARATUS FOR AUTOMATIC PHASE ADJUSTMENT IN A PHASE LOCKED LOOP

[75] Inventor: Lars-Göte Svenson, Stockholm, Sweden

[73] Assignee: Telefonaktiebolaget L M Ericsson, Stockholm, Sweden

[21] Appl. No.: 450,430

[22] Filed: Dec. 14, 1989

[30] Foreign Application Priority Data

Jan. 16, 1989 [SE] Sweden .................................. 8900139

[51] Int. Cl.⁵ ...................... H03L 7/085; H04L 7/033
[52] U.S. Cl. ..................................... 331/1 A; 331/17; 331/27; 307/514; 328/133; 375/120
[58] Field of Search ...................... 331/1 A, 17, 25, 27; 307/514, 516; 328/133, 134; 375/81, 120

[56] References Cited

U.S. PATENT DOCUMENTS 4,380,815  4/1983  Clendening ............................ 375/80
4,535,459  8/1985  Hogge, Jr. ............................. 375/80

FOREIGN PATENT DOCUMENTS 286329 10/1988 European Pat. Off. .

Primary Examiner—Siegfried H. Grimm
Attorney, Agent, or Firm—Burns, Doane, Swecker & Mathis

[57] ABSTRACT

The invention relates to automatic phase adjustment in a phase locked loop including an oscillator (Os) with a controllable frequency. The oscillator generates a timing signal which is used together with a received data signal (1) to form two pulse trains (9,10) which comprise pulses of a duration which in the first pulse train (9) is independent of, and in the second pulse train (10) is responsive to, the phase position of the timing signal relative the phase position of the data signal. The pulse trains are utilized to form a control signal to the oscillator (Os). In forming the pulse trains (9,10) there is utilized a first array of signals (6-8) which are formed by the data signal (1) being sampled in several different phase positions with the aid of mutually phase shifted clock signals (2-4). A rapid locking-in of the phase locked loop is obtained in accordance with the following. The signals in the first array are sampled simultaneously with the aid of a common clock signal (11), whereby a second array of signals (12-14) is formed. The signals (12-14) in the second array are compared with each other and an error signal (15,16) is formed if there is deviation. The error signal is used to amplify the control signal to the oscillator (Os).

6 Claims, 8 Drawing Sheets

METHOD AND APPARATUS FOR AUTOMATIC PHASE ADJUSTMENT IN A PHASE LOCKED LOOP

TECHNICAL FIELD

The invention relates to a method and apparatus for automatic phase adjustment in a phase locked loop, and includes an oscillator with a controllable frequency for generating a timing signal. Two pulse trains are formed from the timing signal and a received data signal, these trains consisting of pulses with a pulse duration which in the one pulse train is independent of, and in the other pulse train is dependent on, the phase position of the timing signal relative the data signal phase position. The pulse trains are utilized to form a control signal to the oscillator.

BACKGROUND ART

An apparatus of the kind mentioned above is already known from the U.S. Pat. No. 4,535,459. In this apparatus, there are included two series-connected D flip-flops, and the received data signal is applied to the data input of the first flip-flop. Two anti-phase clock signals are formed from the oscillator timing signal, one of the clock signals being taken to the clock input on one flip-flop and the other being taken to the clock input on the other flip-flop. There are thus obtained two differently delayed copies of the data signal on the outputs of the flip-flops. The data signal and the first delayed copy, which occur on the first flip-flop, are supplied to a first EXCLUSIVE-OR gate. There is thus formed a pulse train with pulse duration responsive to the phase position of the timing signal from the oscillator relative the phase position of the received data signal. Both delayed copies of the data signal occurring at the second flip-flop are supplied to a second EXCLUSIVE-OR gate. There is thus formed a pulse train with a pulse duration which is independent of the above-mentioned phase position. Both pulse trains are integrated, and a control signal to the oscillator is formed, this signal being responsive to the difference between the integrated pulse trains.

DISCLOSURE OF INVENTION

The object of the present invention is to provide a method and apparatus of the kind mentioned in the introduction, with which a more rapid phase locking of the loop is obtained than with the previously known apparatus mentioned above. In forming the two pulse trains there is utilized, in accordance with the invention, a first array of delayed copies of the data signal, which are formed by the signal being sampled in several different phase positions. The delayed copies are subsequently sampled simultaneously, thus forming a second array of delayed copies of the signal. The delayed copies in the second array are compared with each other and an error signal is formed if there is any deviation, this signal being used to amplify the control signal to the oscillator.

The apparatus includes a first and a second set of sampling means, the first set all obtaining the received data signal and clock signals which are mutually phase shifted. The first set of sampling means generates the first array of delayed data signal copies. The second set of sampling means forms the second array of delayed copies, each sampling means obtaining its respective one of the delayed copies from the first array and a common clock signal.

The characterising features of the invention are disclosed in the claims.

BRIEF DESCRIPTION OF DRAWINGS

The invention will now be described in more detail below with reference to the drawings, on which

BEST MODE FOR CARRYING OUT THE INVENTION

Figure 1:
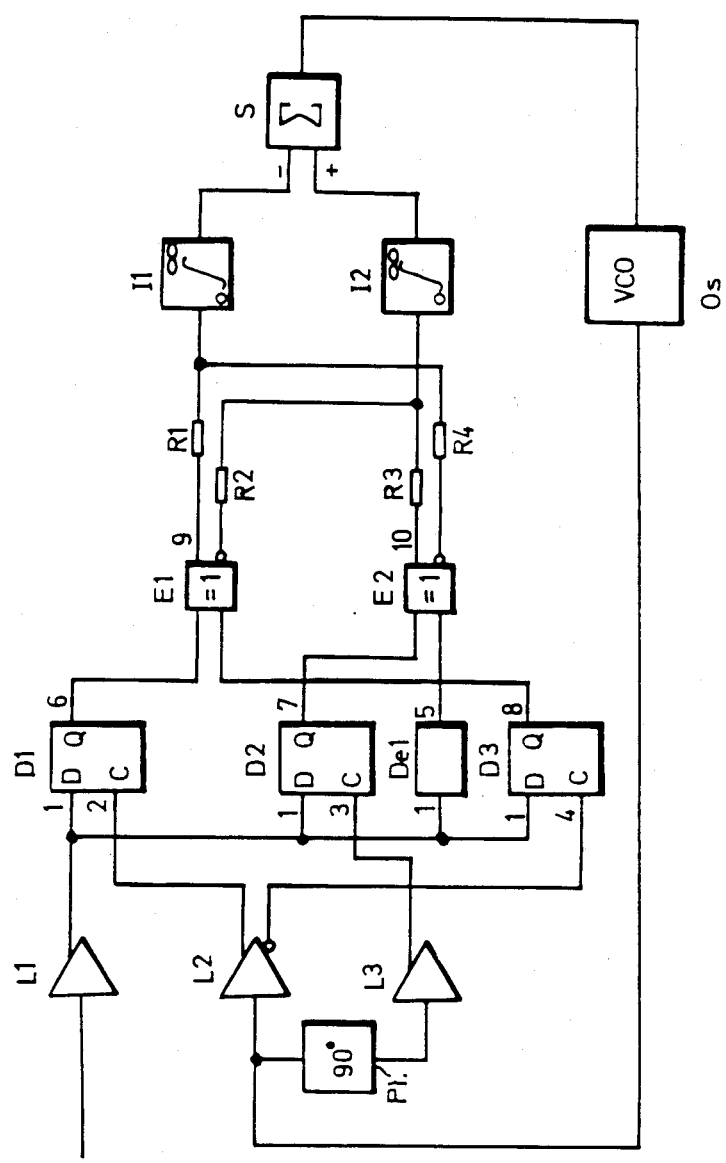
FIG. 1 illustrates an embodiment example of a part of an apparatus in accordance with the invention.
Figure 4:
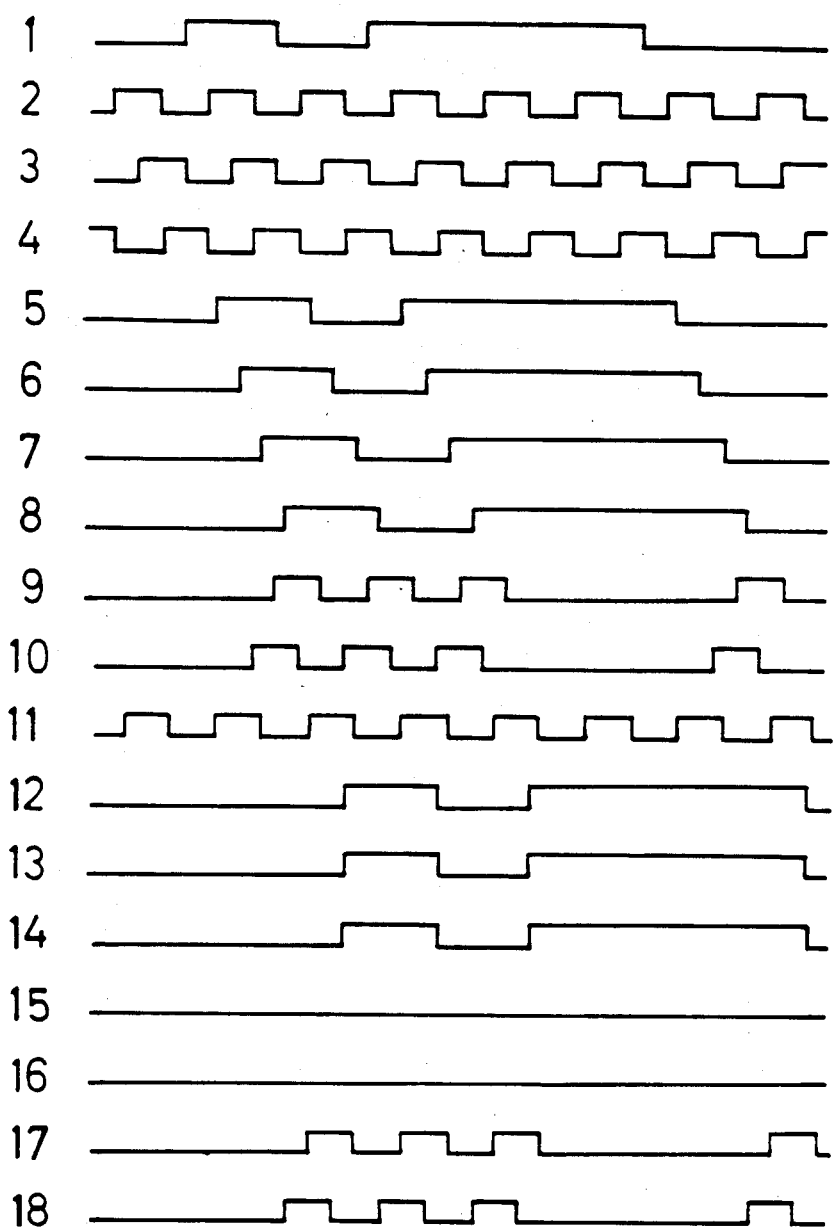
Figure 5:
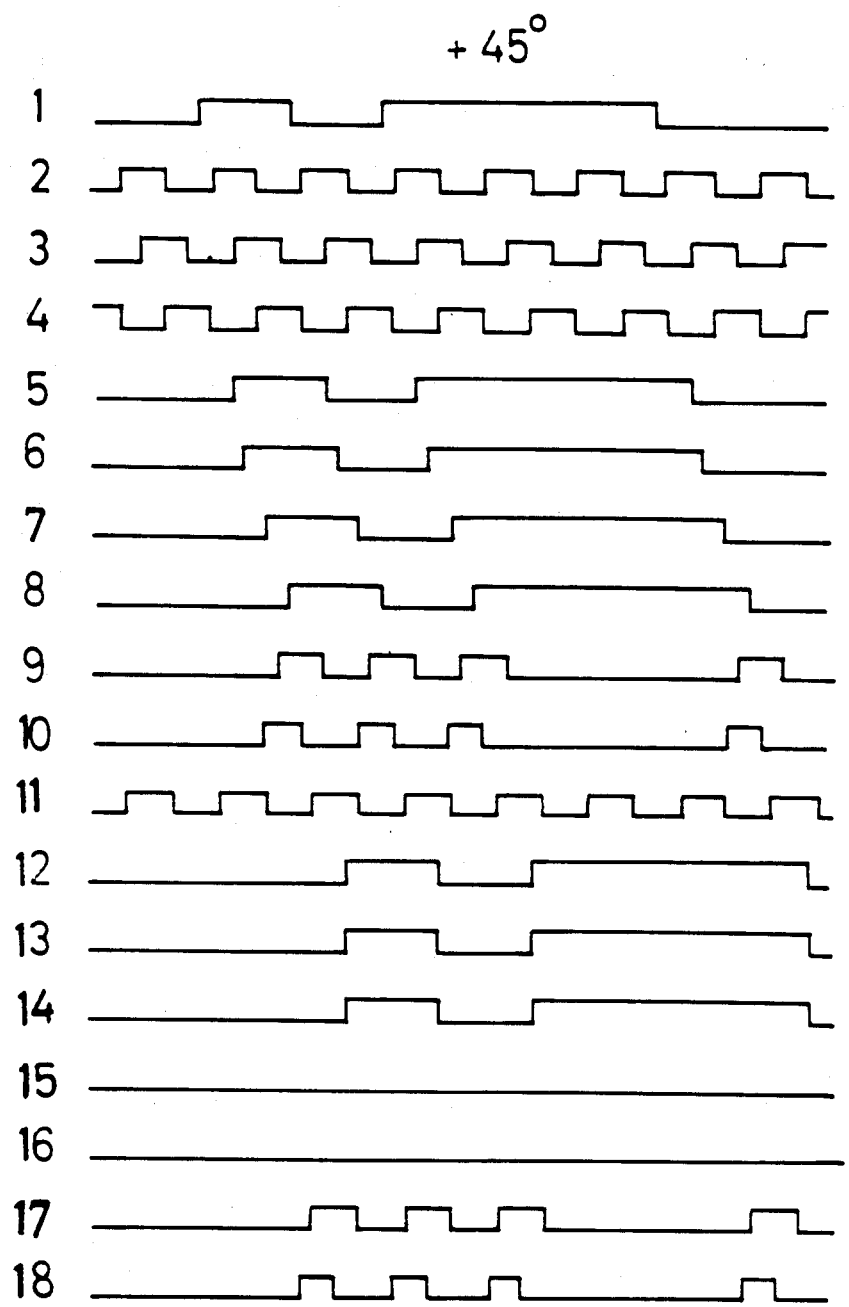

In FIG. 1 there is illustrated an embodiment example of a part of an apparatus in accordance with the invention. A received data signal, which is NRZ coded in the example, is limited in an amplifier L1 to a signal denoted by the numeral 1, and is then supplied to the data inputs on three D flip-flops D1–D3.3 FIG. 4 is primarily referred to with regard to signals. The data signal 1 is also supplied to a delaying means De1 for achieving a delay which is equally as great as the unavoidable delay occurring in the flip-flops D1–D3. The data signal is sampled by the flip-flops D1–D3 with the aid of three mutually phase-shifted clock signals 2–4. The clock signals originate from an oscillator Os which has a controllable frequency, i.e. it is a so-called voltage controlled oscillator (VCO). The oscillator output signal is supplied to an amplifier L2 with an inverting output and a non-inverting output, as well as to an amplifier L3 via a phase-shifting means Ph which provides a 90° phase shift. The clock signals 2–4 thus have the mutual phase positions 0°, 90° and 180°.

The signals illustrated in FIG. 4 are examples of signals occurring when the output signal of the oscillator Os, and consequently the clock signals 2–4, is in the right phase position, which is denoted by 0° at the top of the figure. At the delay and the samplings of the data signal 1 there are formed four delayed copies 5–8 of the signal, which are delayed different amounts in response to the different clock signals 2–4. In the pulse diagrams, consideration has also been paid to the unavoidable delay which is assumed to occur for other reasons in flip-flops and gates. The signals 6 and 8 are compared in an EXCLUSIVE-OR gate E1, to form a pulse train 9, this pulse train includes pulses of a duration which is equal to one-half of a bit slot of the data signal pulses irrespective of the phase position of the output signal from the oscillator Os relative to the phase position of the received data signal. This is because the clock signals 2 and 4 to the flip-flips D1 and D3 are in anti-phase to each other. Pulses in the pulse train 9 are designated reference pulses below.

The signals 5 and 7 are compared in an EXCLUSIVE-OR gate E2 to form a pulse train 10. This pulse train includes pulses the duration of which is responsive to the phase position of the output signal from the oscillator Os. This is due to the fact that the signal 5, which is simply a delayed data signal 1, is independent of the phase position of the oscillator signal, while the signal 7 is responsive to the phase position of this signal. For the right phase position (see FIG. 4), the data signal 1 will be sampled in the middle of the bit slot by the flip-flop D2 with the clock signal 3, resulting in that the pulses in the pulse train 10 will then have an equally as long duration as the reference pulses. The pulses in the pulse train 10 will be referred to below as the variable pulses. It may be mentioned that the data signal for the right phase position of the oscillator signal will be sampled early in the bit slot by the flip-flop D1 with the clock signal 2 and late in the same bit slot by the flip-flop D3 with the clock signal 4.

It should be noted that the delaying means De1 only has the task of compensating from the unavoidable delay occurring in the flip-flops. If the delay in them is considerably less than the time for a bit slot, the delaying means De1 can then be excluded. A delay of a digital signal is obtained most simply by the introduction of a gate, for example.

The reference pulses 9 and the variable pulses 10 are integrated in two integrators I1 and I2. The output signals from the integrators are supplied to a difference forming means S, which in turn generates a control signal to the oscillator Os, which thus has its output signal controlled to the right phase position.

As will be seen from FIG. 1, the integrators E1 and E2 are supplied with differential output signals from the gates E1 and E2 via four resistors E1-E4. This increases the locking-in rate of the locked loop and is known per se from the above-mentioned U.S. Pat. No. 4,535,459.

As mentioned above, the apparatus according to FIG. 1 is a part of an apparatus in accordance with the invention. The variable pulses 10 are generated principly in the same way as the known apparatus, in which two series-connected flip-flops are utilized. On the other hand the reference pulses 9 are generated in a completely different way compared with the corresponding pulses in the known apparatus, by the data signal 1 being sampled in several different phase positions. This difference will not achieve any more rapid locking-in of the phase locked loop, per se, but with the illustrated apparatus there is enabled a more rapid locking-in of the loop with the aid of a supplementary part which is included in the apparatus according to FIG. 2.

Figure 2:
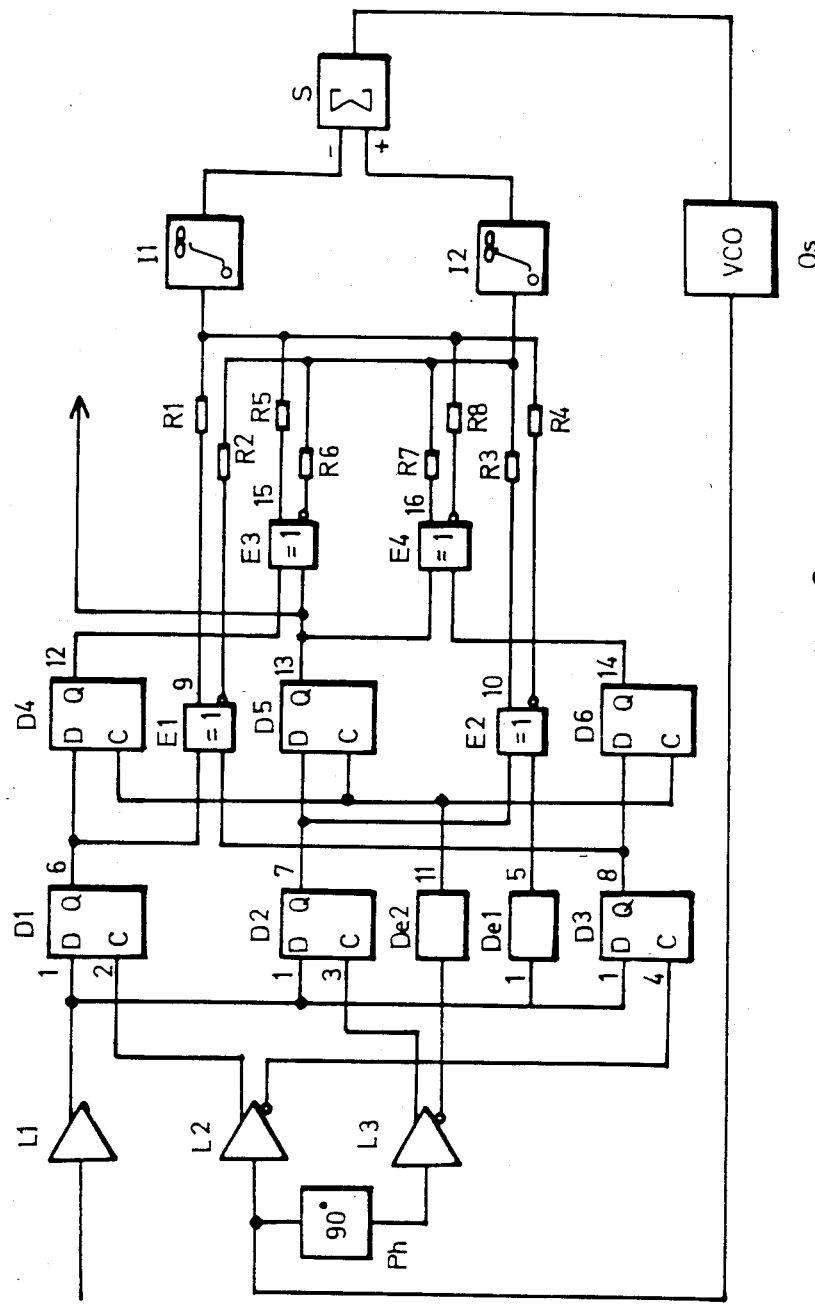
FIG. 2 illustrates an embodiment example of a complete apparatus in accordance with the invention.

In FIG. 2, there is thus illustrated an embodiment example of a complete apparatus in accordance with the invention. Further to the means illustrated in FIG. 1 there are included, inter alia, three D flip-flops D4-D6. On their data inputs these obtain the delayed copies 6-8 of the data signal 1. These copies are sampled by the flip-flops D4-D6 with the aid of a common clock signal 11, coming from an inverting output on the amplifier L3 and which has passed a delaying means De2, with equally as great delay as the means De1. The delaying means D2 can, however, be excluded for the same reasons as the means De1 can be excluded. In such cases the clock signals 3 and 11 will be in anti-phase.

By sampling the delayed clock signals 6-8 there is further formed three delayed copies 12-14 of the data signal 1. However, these copies are delayed equally as much in relation to the original signal 1, providing that the phase error of the output signal of the oscillator Os and thus also the clock signals 2-4 and 11, falls below 90°. This will be explained more closely in connection with FIGS. 5-8.

The signals 12 and 13 are compared in an EXCLUSIVE-OR gate E3, and the signals 13 and 14 are compared in an EXCLUSIVE-OR gate E4, in certain cases error signals 15 and 16 then occur on the outputs of the gates. The error signals are suitably generated in the form of differential signals, which increases sensitivity, and they are added to the pulse trains 9 and 10 from the gates E1 and E2, as will be seen from FIG. 2. A further four resistors R5-R8 are utilized in this case. For a phase error which is less than 90°, no error signals 15, 16 will occur, due to the signals 12-14 then being identical.

In FIGS. 5-8 there are illustrated examples of signals occurring when the phase error of the output signal of the oscillator is +45, +135°, −45° and −135°. When the phase error increases in a positive direction, the pulse duration in the variable pulses 10 decreases. In the illustrated examples, the pulse duration is therefore least in FIG. 6 (+135°) and greatest in FIG. 8 (−135°). For the correct phase position (FIG. 4), the variable pulses 10 have equally as long duration as the reference pulses 9, which will also have been understood from above. When the phase error is less than 90°, the flip-flops D1-D3 will sample the received data signal 1 in the same bit slot. This will be seen from FIGS. 4, 5 and 7 (0°, +45° and −45°). According to FIG. 5 (+45°), the data signal is sampled early, according to FIG. 4 (0°) it is sampled in the middle, and according to FIG. 7 (−45°) it is sampled late in the bit slot. When the phase error is less than 90°, the copies 6-8 of the data signal which are delayed different amounts will also be sampled in the same bit slot by the flip-flops D4-D6 with the aid of the common clock signal 11. This results in that the signals 12-14 will be identical, and no error signals 15, 16 will be generated.

Figure 6:
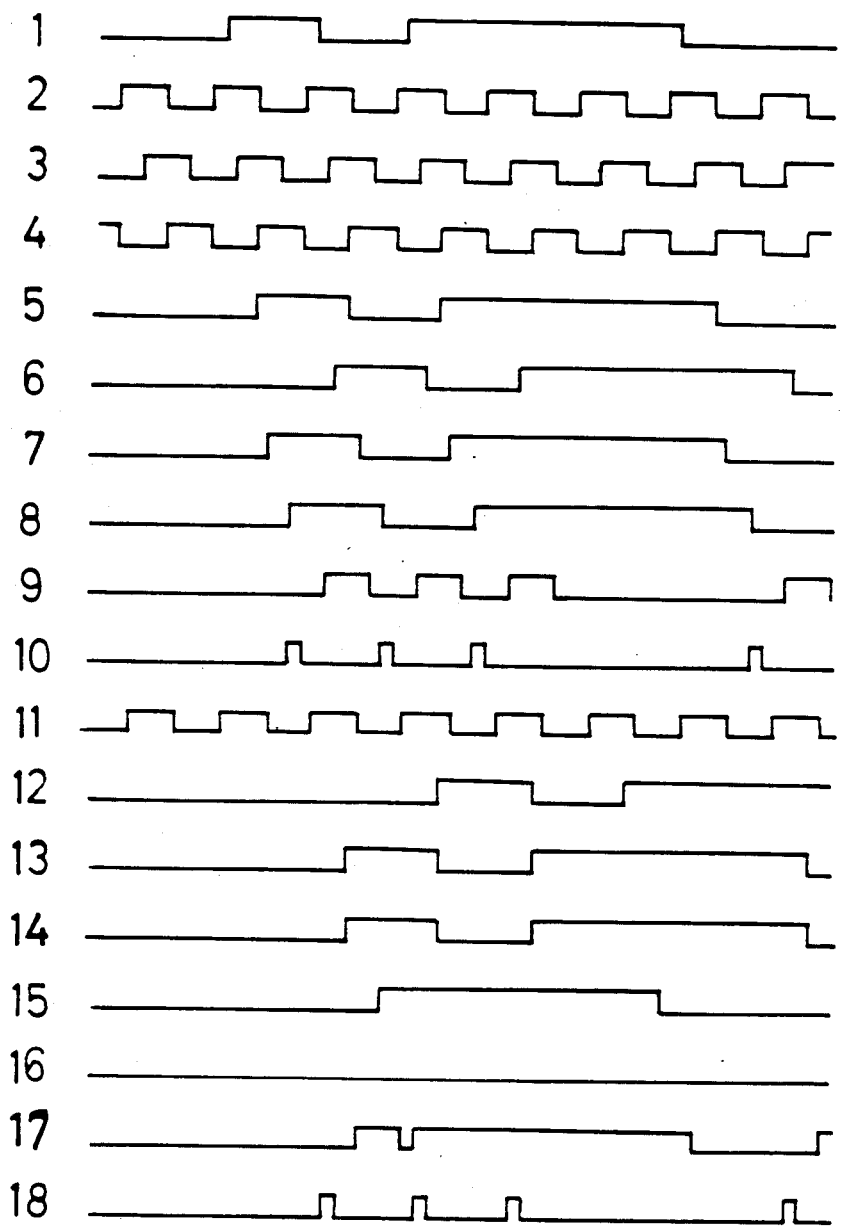
Figure 7:
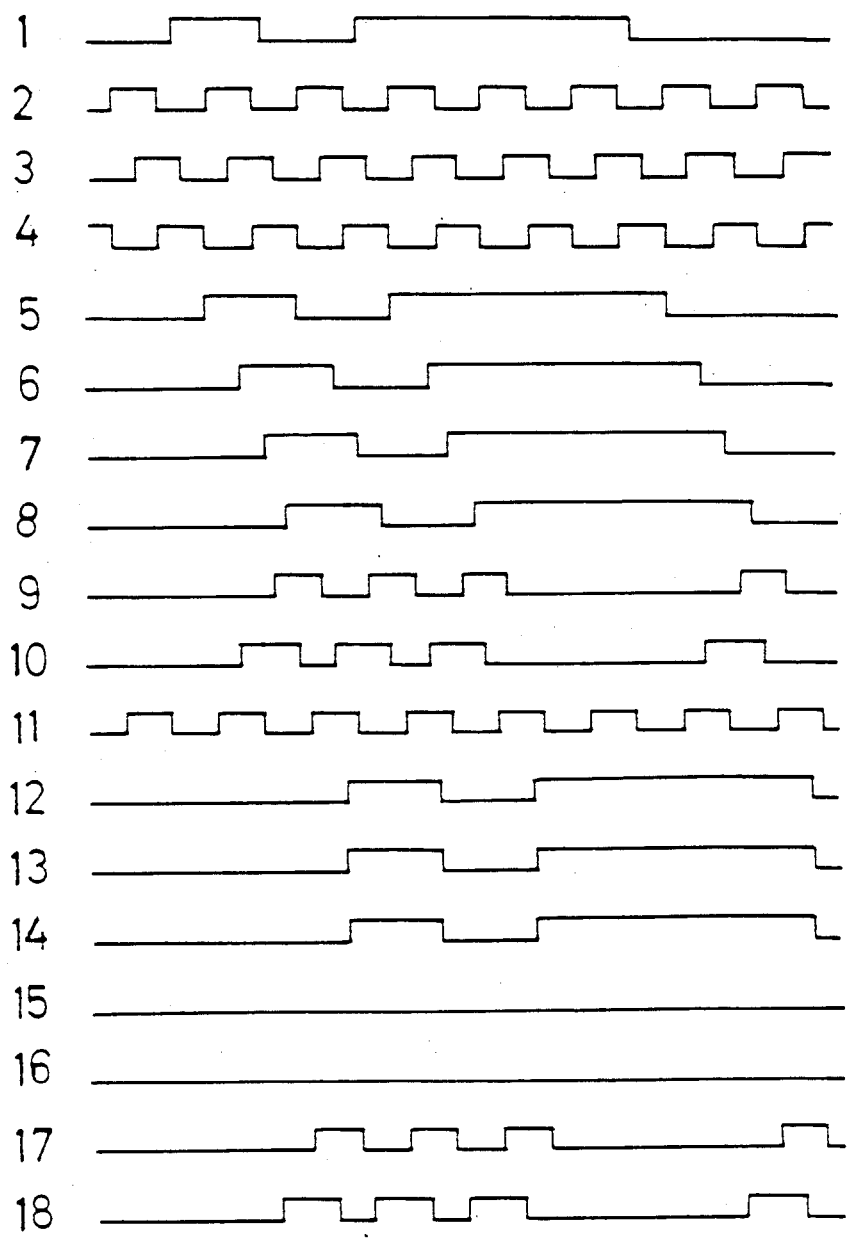
Figure 8:
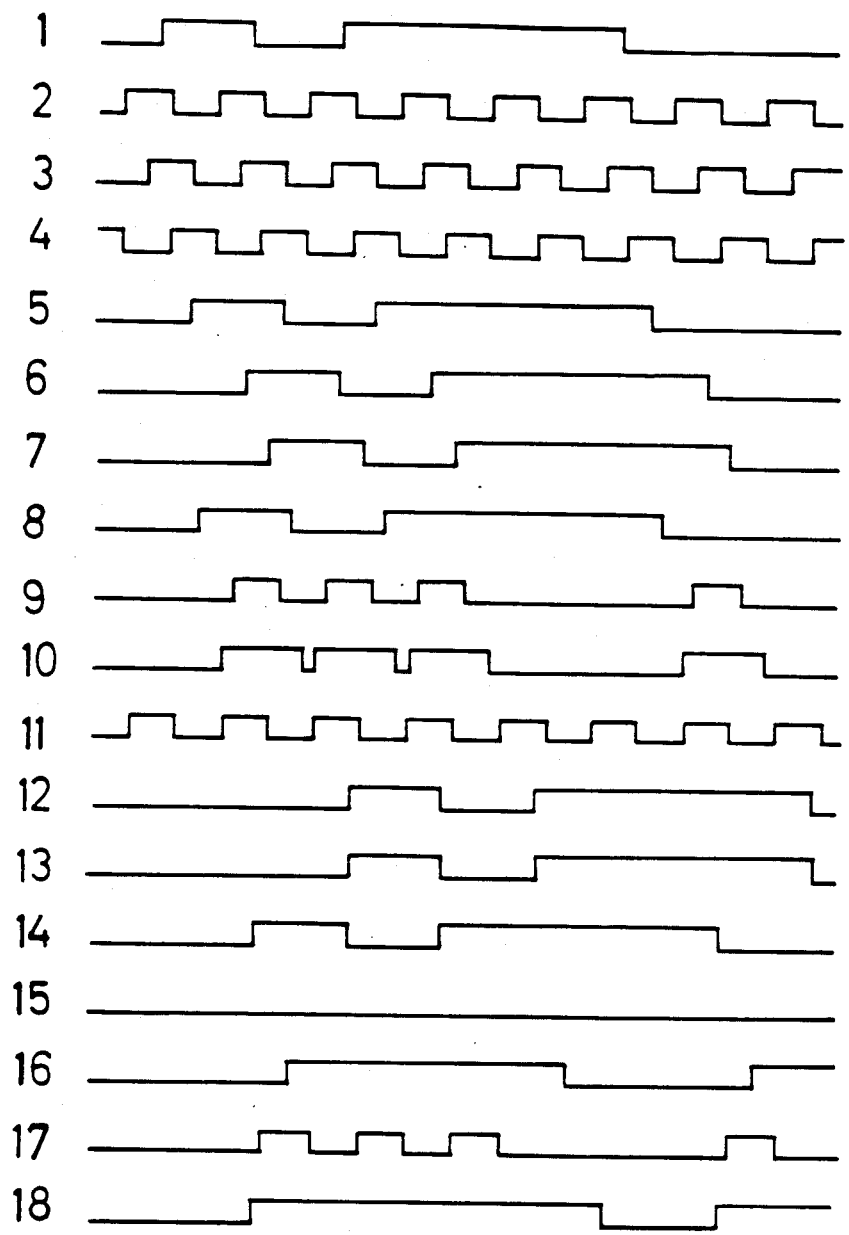

In FIGS. 6 (+135°) and 8 (−135°), the phase error is greater than 90°. In these cases, the data signal 1 is no longer sampled in the same bit slot by the clock signals 2-4. This results in that the signals 6-8 will not be sampled in the same bit slot by the clock signal 11. The signals 12-14 from the flip-flops D4-D6 will then no longer be identical. In turn, this results in that error signals 15, 16 will be generated by the gates E3, E4. More specifically, in the case with a large positive phase error according to FIG. 6, an error signal 15 will be generated, and in the case with a large negative phase error according to FIG. 8, an error signal 16 will be generated.

The error signals 15 and 16 are more powerful than the corresponding signals 9, 10 from the gates E1 and E2 and furthermore they disappear for small phase errors. Since the amplification in the integrators I1 and I2 can be dimensioned differently for the signals 15, 16 on the one hand, and the signals 9, 10 on the other hand, the loop can be rapidly controlled into the correct phase position with the aid of the signals 15, 16 and then obtain in the correct phase position desired properties for a locked loop with the aid of the signals 9, 10.

It may be mentioned that the signal 13 from the flip-flop D5 also functions as the output signal of the apparatus, due to the delayed copy 7 of the data signal 1 always being sampled in the middle of the bit slot by the clock signal 11. This is due to the clock signals 3 and 11 will be in anti-phase if consideration is not given to the delays in the flip-flop D2 and the delaying means De1.

Figure 3:
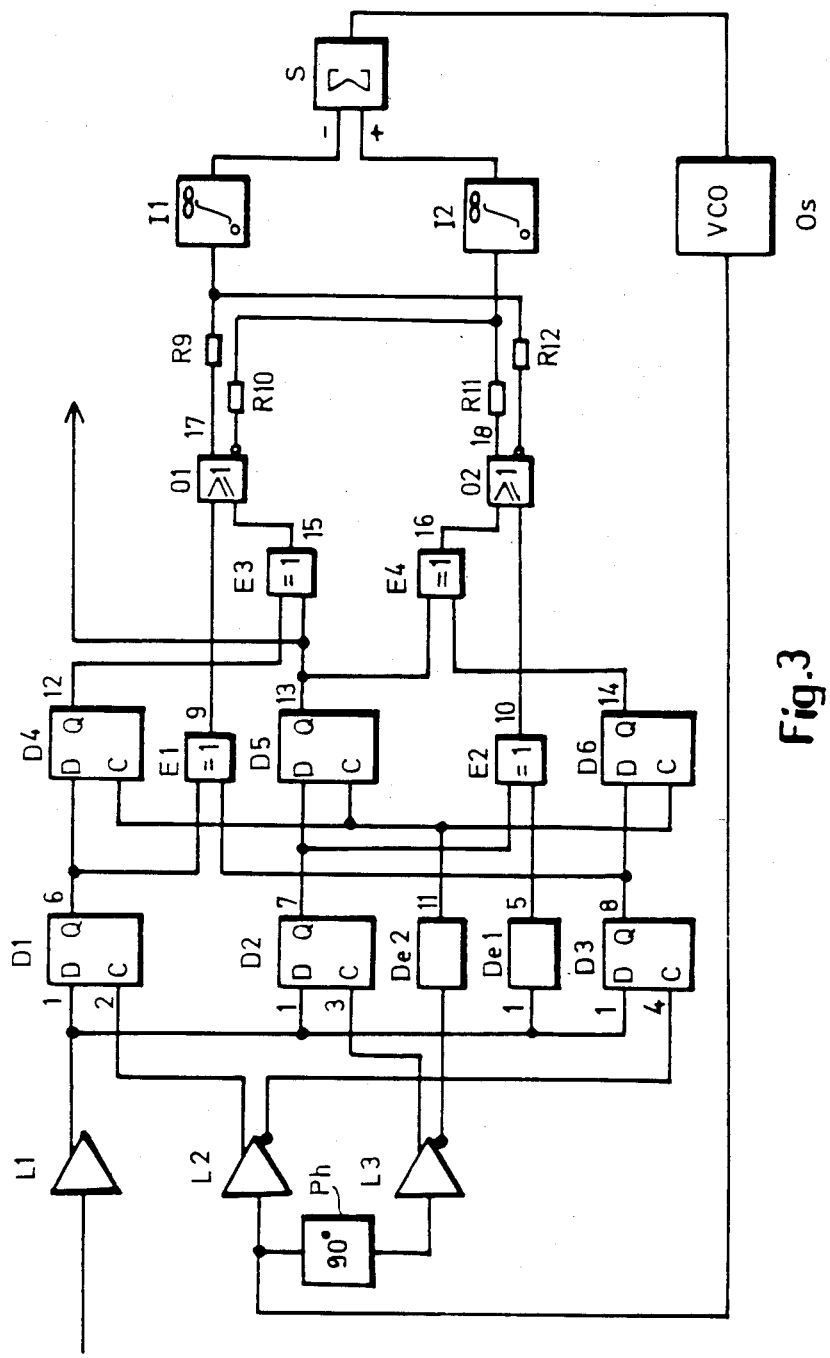
FIG. 3 illustrates an embodiment example of an apparatus which is somewhat simplified compared with the apparatus according to FIG. 2, and FIGS. 4–8 are pulse diagrams each showing signals at different points in the apparatus according to FIGS. 1–3, but for differently great phase errors of the timing signal from the oscillator.

In FIG. 3 there is illustrated an apparatus which is somewhat simplified compared with the apparatus according to FIG. 2. Instead of allowing the EXCLUSIVE-OR gates E1-E4 to generate both non-inverted and inverted signals 9, 10 and 15, 16, only the non-inverted signals are generated. The signals from the gates E1 and E3 on the one hand, and from the gates E2 and E4 on the other hand, are combined in two OR gates 01 and 02. From these gates, two control signals 17 and 18, suitably in differential form, are taken to the integrators I1 and I2 via four resistors R9–R12. With this apparatus, there is obtained a less number of connections between phase comparator and integrators.

I claim:

1. Method of automatic phase adjustment in a phase locked loop, including an oscillator (Os) with a controllable frequency for generating a timing signal, where two pulse trains (9, 10) are formed from the timing signal and a received data signal (1), the pulse trains containing pulses of a duration which in one pulse train (9) is independent of, and in the other pulse train (10) responsive to the phase position of the timing signal relative the phase position of the data signal (1), and where both pulse trains are utilized to form a control signal to the oscillator (Os), characterized in that for forming the two pulse trains (9, 10) there is utilized a first array of signals (6–8) which are formed by the data signal (1) being sampled in several different phase positions, in that a second array of signals (12–14) is formed by the signals (6–8) in the first array being sampled simultaneously; and in that the signals (12–14) in the second array are compared (E3, E4) with each other to form an error signal (15, 16) if there is any deviation, this signal being utilized together with said two pulse trains (9, 10) and being in co-action with them for forming the control signal to the oscillator (Os).

2. Method as claimed in claim 1, characterized in that the timing signal is formed by a first, second and third clock signal (2–4), which are used in sampling the data signal (1) and in order have mutual phase positions corresponding, at least approximately, to 0°, 90° and 180°, and also in that a fourth clock signal 11 is formed, which is used in sampling said first array of signals (6–8) and which has a phase position relative said second clock signal (3) such that the signal (7) formed on sampling with said second clock signal (3) will be sampled in the middle of each bit slot, at least approximately, in sampling with said fourth clock signal (11).

3. Apparatus for automatic phase adjustment in a phase locked loop, including an oscillator (Os) with a controllable frequency for generating a timing signal, means (L2,L3,PH,D1-D3,De1,E1,E2) for forming two pulse trains (9,10) from the timing signal and a received data signal (1), the pulse trains containing pulses with a duration which in one pulse train (9) is independent of, and in the second pulse train (10) responsive to, the phase position of the timing signal relative the phase position of the data signal (1), and means (I1,I2,S) which obtain both pulse trains (9,10) and are adapted such as to form a control signal to the oscillator (Os), characterized in that the apparatus includes means (PH,L2,L3) for forming from the timing signal a plurality of mutually phase shifted clock signals (2–4); a first set of sampling means (D1-D3), each of which obtains the received data signal (1) and its respective one of these clock signals (2–4), whereby a first array of mutually phase shifted signals (6–8) is formed; a second set of sampling means (D4–D6) each of which obtains its respective signal (6–8) from the first array and a common clock signal (11), whereby a second array of signals (12–14) is formed; as well as means (E3,E4) including EXCLUSIVE-OR responsive logical elements for comparing the signals (12–14) in the second array with each other and where deviation occurs between them for forming an error signal (15,16); and in that said means (I1,I2,S) obtaining said two pulse trains (9,10) also obtain the error signal (15,16), and are adapted such that co-action is achieved between the error signals (15,16) and the two pulse trains (9,10) for forming a control signal to the oscillator (Os).

4. Apparatus as claimed in claim 3, characterized in that said mutually phase shifted clock signals include a first, second and third clock signal (2–4), which in turn have mutual phase positions corresponding, at least approximately, to 0°, 90° and 180°, and in that said common clock signal (11) has a phase position relative said second clock signal (3) such that the signal (7) formed on sampling with said second clock signal (3) will be sampled, at least approximately, in the middle of each bit slot in sampling with said common clock signal (11).

5. Apparatus as claimed in claim 3, characterized in that said means (E3,E4) for forming an error signal (15,16) include a first EXCLUSIVE-OR gate (E3) for comparing a first (12) and a second (13) signal from the second array of signals (12–14), and a second EXCLUSIVE-OR gate (E4) for comparing said second signal (13) and a third signal (14) from the second array of signals (12–14).

6. Apparatus as claimed in claim 5, characterized in that said means for forming pulse trains (9,10) has two outputs, of which one (9) and an output from the first EXCLUSIVE-OR gate (E3) are connected to a first OR gate (01), and the second (10) and an output from the second EXCLUSIVE-OR gate (E4) are connected to a second OR gate (02).

* * * * *